US009824867B2

(12) United States Patent
Furuya

(10) Patent No.: US 9,824,867 B2
(45) Date of Patent: Nov. 21, 2017

(54) PLASMA GENERATION APPARATUS, DEPOSITION APPARATUS, AND PLASMA GENERATION METHOD

(71) Applicant: CHUGAI RO CO., LTD., Osaka-shi, Osaka (JP)

(72) Inventor: Eiji Furuya, Osaka (JP)

(73) Assignee: CHUGAI RO CO., LTD., Osaka-Shi, Osaka (JP)

( * ) Notice: Subject to any disclaimer, the term of this patent is extended or adjusted under 35 U.S.C. 154(b) by 9 days.

(21) Appl. No.: 14/391,499

(22) PCT Filed: Feb. 27, 2013

(86) PCT No.: PCT/JP2013/055231
§ 371 (c)(1),
(2) Date: Oct. 9, 2014

(87) PCT Pub. No.: WO2013/153865
PCT Pub. Date: Oct. 17, 2013

(65) Prior Publication Data
US 2015/0107987 A1   Apr. 23, 2015

(30) Foreign Application Priority Data

Apr. 12, 2012 (JP) .................................. 2012-090921

(51) Int. Cl.
| H01J 37/34 | (2006.01) |
| C23C 14/32 | (2006.01) |
| H05H 1/46 | (2006.01) |
| H01J 37/32 | (2006.01) |
| C23C 14/35 | (2006.01) |

(52) U.S. Cl.
CPC .......... *H01J 37/3411* (2013.01); *C23C 14/32* (2013.01); *C23C 14/35* (2013.01); *H01J 37/32055* (2013.01); *H01J 37/3266* (2013.01); *H01J 37/3458* (2013.01); *H05H 1/46* (2013.01)

(58) Field of Classification Search
CPC ................................................ H01J 37/32055
See application file for complete search history.

(56) References Cited

U.S. PATENT DOCUMENTS 4,863,581 A * 9/1989 Inokuti .................... C23C 14/28
118/723 EB
5,009,743 A * 4/1991 Swann ................ H01J 37/3056
156/345.39

(Continued)

FOREIGN PATENT DOCUMENTS

| JP | 7-254315 A | 10/1995 |
| JP | 7-326492 A | 12/1995 |

(Continued)

*Primary Examiner* — Timon Wanga
(74) *Attorney, Agent, or Firm* — Birch, Stewart, Kolasch & Birch, LLP

(57) ABSTRACT

Provided is a plasma generation apparatus capable of generating uniform plasma over a wide range. The plasma generation apparatus includes two oppositely arranged plasma guns each injecting a discharge gas to be ionized, and having a cathode for emitting electrons, and a converging coil for forming a magnetic flux to guide the emitted electrons, and polarities of the converging coils with respect to the cathodes in the two plasma guns are opposite to each other.

6 Claims, 3 Drawing Sheets

(56) References Cited

U.S. PATENT DOCUMENTS

| | | | | |
|---|---|---|---|---|
| 6,089,186 | A | * | 7/2000 | Kisoda .................... C23C 14/24 118/723 E |
| 2004/0229465 | A1 | * | 11/2004 | Kiyota .................... C03C 17/36 438/689 |
| 2009/0114154 | A1 | * | 5/2009 | Nakagawara ........... C23C 14/32 118/723 ME |
| 2011/0011734 | A1 | | 1/2011 | Marunaka et al. |

FOREIGN PATENT DOCUMENTS

| | | |
|---|---|---|
| WO | WO 02/086937 A1 | 10/2002 |
| WO | WO 2007/099658 A1 | 9/2007 |

* cited by examiner

PLASMA GENERATION APPARATUS, DEPOSITION APPARATUS, AND PLASMA GENERATION METHOD

TECHNICAL FIELD

The present invention relates to a plasma generation apparatus, a deposition apparatus, and a plasma generation method.

BACKGROUND ART

Conventionally, there has been a method known as a plasma assist method by which a chemical reaction of a deposition material is accelerated due to plasma generated in a chamber at the time of deposition. In the plasma assist method, the plasma is normally formed by a plasma gun which injects a discharge gas to form the plasma while emitting electrons to ionize the discharge gas.

In general, the plasma gun includes a converging coil for forming a magnetic flux to guide the emitted electrons. When the converging coil is provided, the electrons emitted from the plasma gun move while winding around a magnetic field formed by the converging coil, so that the plasma can reach a position far from the plasma gun.

However, even when the converging coil is used, a range of the plasma that the plasma gun can form is limited. Therefore, in a case where a deposition target body is large on which a deposition target film is to be formed, there is a need to oppositely arrange two plasma guns to form plasma over a wide range as disclosed in Patent Document 1, for example.

FIG. 3 shows a deposition apparatus in which plasma guns 22 are oppositely arranged on both sides of a chamber 21. The plasma gun 22 is a pressure-gradient type plasma gun and includes a cathode 23 for emitting electrons, a first electrode 24 and a second electrode 25 for forming voltage gradients, a feedback electrode 26 for collecting the electrons, and a converging coil 27 for forming a magnetic flux to guide the electrons. Thus, a discharge gas is injected so as to penetrate centers of those components.

In this deposition apparatus, the magnetic fluxes formed by the converging coils 27 in the opposed plasma guns 22 repel each other. The electrons emitted from the plasma gun 22 travel while winding around the magnetic flux formed by the converging coil 27, so that they turn back along the repelling magnetic flux and return to each feedback electrode 26 as shown by dotted lines in the drawing. Therefore, the electrons are not sufficiently supplied to an intermediate position of the opposed plasma guns 22, and the plasma is low in density at the position, so that an imbalanced discharge region P is formed as shown in the drawing.

Therefore, in a case where the deposition is performed for a large-size panel, a chemical reaction is not sufficiently caused in the center portion because the plasma is low in density there, so that the problem is that a deposition target film is not uniformly formed because the film is poor in adhesiveness or the like.

PRIOR ART DOCUMENT

Patent Document

Patent Document 1: Japanese Patent Laid-open Publication No. JP 7-254315

SUMMARY OF THE INVENTION

Problems to be Solved by the Invention

In view of the above problems, it is an object of the present invention to provide a plasma generation apparatus and a plasma generation method, by which plasma can be uniformly formed over a wide range, and a deposition apparatus capable of uniformly forming a deposition target film.

Solution to the Problems

In order to solve the above problems, a plasma generation apparatus according to the present invention includes two oppositely arranged plasma guns each injecting a discharge gas to be ionized and having a cathode for emitting electrons, and a converging coil for forming a magnetic flux to guide the emitted electrons, in which polarities of the converging coils with respect to the cathodes in the two plasma guns are opposite to each other.

According to this configuration, since the magnetic fluxes formed by the converging coils in the opposed plasma guns are integrated with each other, the integrated magnetic flux is formed so as to penetrate both of the plasma guns. Thus, the electrons emitted from the plasma gun can more surely travel straight, so that the plasma density can be prevented from being lowered in the center. Furthermore, when the plasma is used for the deposition, the chemical reaction at the time of the deposition can be uniformly caused over a wide range.

Furthermore, according to the plasma generation apparatus in the present invention, the plasma gun is a pressure-gradient type plasma gun and includes a first electrode and a second electrode between the cathode and the converging coil, and the second electrode may internally house an electrode internal magnet for forming a magnetic flux having the same direction as the magnetic flux formed by the converging coil.

According to this configuration, since the magnetic flux formed by the electrode internal magnet and the magnetic flux formed by the converging coil are integrated with each other, the discharge can be stably performed under the condition that the electrons are trapped by the magnetic fluxes inside the plasma gun.

Furthermore, according to the plasma generation apparatus in the present invention, the two plasma guns may be driven by two drive circuits insulated from each other, respectively.

According to this configuration, since a discharge amount of the plasma gun can be individually adjusted, the discharge amount of the one plasma gun can be adjusted so as not to become larger due to asymmetry of a space or the like, so that the plasma can be prevented from becoming imbalanced.

Furthermore, according to the plasma generation apparatus in the present invention, at least one of a position and an angle of the converging coil may be individually adjustable.

According to this configuration, since imbalance in plasma flow due to the asymmetry of the space or the like can be corrected by adjusting the position and the angle of the converging coil, the plasma can be uniformly generated.

Furthermore, according to the plasma generation apparatus in the present invention, the plasma gun may include a feedback electrode for collecting the electrons emitted from the cathode, and the feedback electrode may be connected to a circuit in the opposed plasma gun.

According to this configuration, since the electrons emitted from the one plasma gun are collected in the other plasma gun, so that the electrons can more surely travel straight, and the plasma density can be uniformed.

Furthermore, a deposition apparatus according to the present invention has any one of the above plasma generation apparatuses.

Effects of the Invention

As described above, according to the present invention, the plasma can be uniformly generated over a wide range. Therefore, at the time of the deposition, the chemical reaction is uniformly caused in the deposition material, so that the deposition target film can be uniformly formed even on the large-size deposition target body.

EMBODIMENTS OF THE INVENTION

Figure 1:
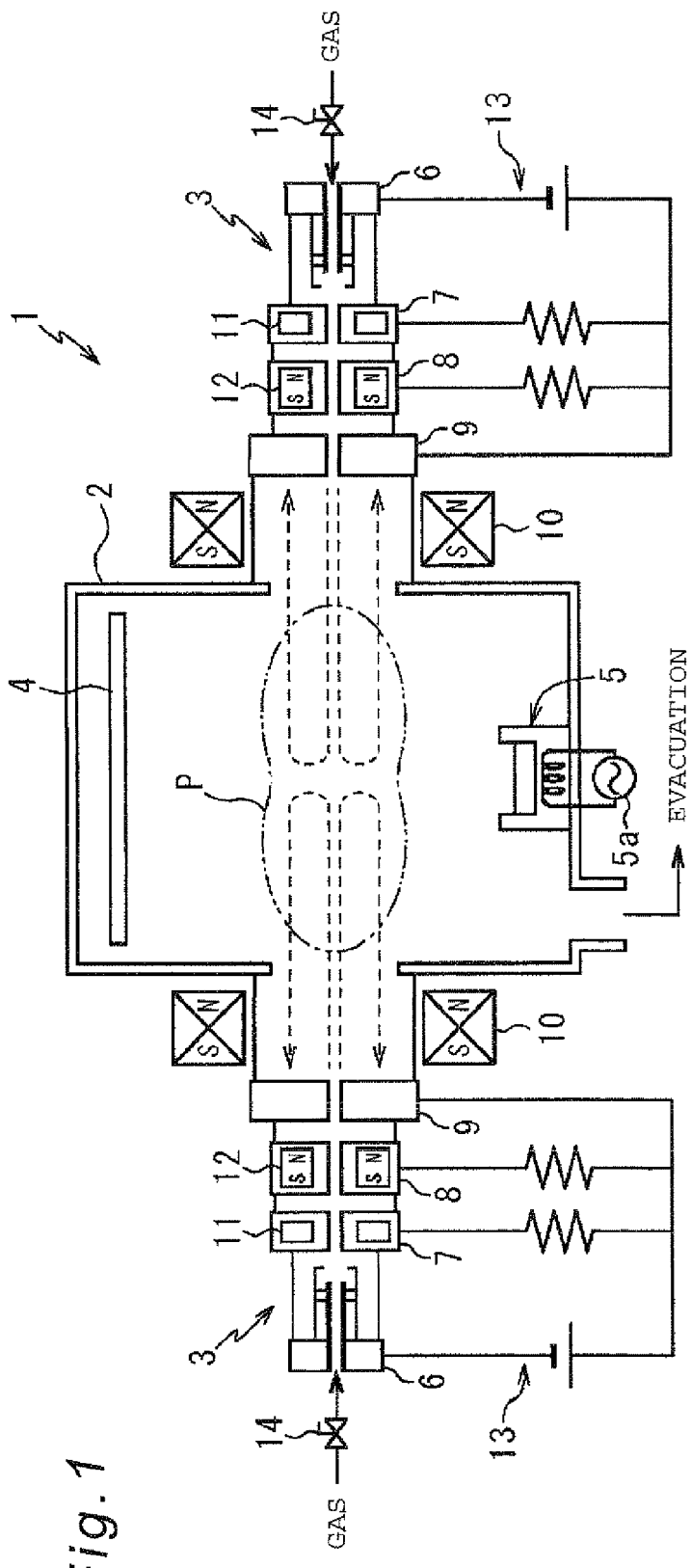
FIG. 1 is a schematic configuration diagram of a deposition apparatus according to a first embodiment of the present invention.

Hereinafter, embodiments of the present invention will be described with reference to the drawings. FIG. 1 shows a configuration of a deposition apparatus 1 according to a first embodiment of the present invention. The deposition apparatus 1 includes a chamber 2 whose inside can be evacuated, and a pair of pressure-gradient type plasma guns 3 each arranged so as to see the inside of the chamber 2 through an opening provided in a side wall on each side of the chamber 2.

A glass substrate 4 serving as a deposition target body can be held in an upper portion in an inner space of the chamber 2 so that metal is deposited onto its surface, and a crucible 5 for dissolving a deposition material is arranged in a bottom portion in the inner space thereof. The crucible 5 is provided with a heater 5a for heating the deposition material. The heater 5a can adopt a DC or AC resistance heating method, and a method using an electron beam as well.

The plasma gun 3 has a cathode 6 for emitting electrons, a first electrode 7 and a second electrode 8 for forming potential gradients along an orbit of the electrons, a feedback electrode 9 for collecting the electrons emitted from the cathode 6, and an converging coil 10 for forming a magnetic flux for guiding the electrons emitted from the cathode 6. The first electrode 7 is an annular hollow electrode internally housing a first electrode internal magnet 11 composed of a permanent magnet. The second electrode is an annular hollow electrode internally housing a second electrode internal magnet 12 composed of an air core coil. The components of the plasma gun 3 and the plasma gun 3 are connected to the chamber 2 with a tube made of metal or glass, in order to ensure airtightness.

In addition, each of the two plasma guns 3 has a drive circuit 13 for applying a discharge voltage to the cathode 6, the first electrode 7, the second electrode 8, and the feedback electrode 9. The two drive circuits 13 are electrically insulated from each other and can be separately adjusted. Furthermore, each of the plasma guns 3 injects a discharge gas such as argon gas which is ionized and becomes plasma so that the discharge gas penetrates centers of the cathode 6, the first electrode 7, the second electrode 8, the feedback electrode 9, and converging coil 10, and the plasma gun 3 has an adjusting valve 14 for adjusting a flow amount of the injected discharge gas individually.

A DC voltage is applied from a power supply (not shown) to the converging coil 10 and the second electrode internal magnet 12 so that they have the same polarity direction. Each of the converging coil 10 and the second electrode internal magnet 12 is wound so that a current flows around a center axis of the plasma gun 3, and forms a magnetic flux which penetrates an inside of the coil. Thus, the polarity shown in the drawing only shows the direction of a magnetic pole, and it does not mean that a magnetic flux extends from the pole shown in the drawing.

Here, it is to be noted that the polarity of the converging coil 10 and the electrode internal magnet 12 toward the cathode 6 in the right plasma gun 3 is opposite to that in the left plasma gun 3. That is, all of the converging coils 10 and the electrode internal magnets 12 have the same absolute polarities. More specifically, in the drawing, the S pole is provided on the left side and the N pole is provided on the right side, as a whole. Therefore, the magnetic fluxes formed by the converging coils 10 and the electrode internal magnets 12 on both sides are integrated with each other, so that the integrated magnetic flux is formed so as to linearly penetrate the right and left plasma guns 3 along the center axes of the right and left plasma guns 3.

The electrons emitted from the cathode 6 travel while winding around the magnetic flux going straight between the right and left plasma guns 3. Thus, as shown by dotted lines in the drawing, the electrons emitted from the plasma guns 3 on both sides repel from each other by coulomb force, and separate from the magnetic flux in a center portion of the chamber 2, and then return to the respective feedback electrodes 9. Since the drive circuits 13 of the two plasma guns 3 are insulated from each other, the number of electrons returning to the feedback electrode 9 is the same as that of the electrons emitted from the cathode 6 in the same plasma gun 3. Thus, the electrons evenly return to each of the feedback electrodes 9, so that there is no imbalance in electron flow in the chamber 2.

When the electrons are emitted and the discharge gas is supplied from the plasma gun 3 under the condition that the chamber 2 is evacuated, the discharge gas is ionized, and plasma can be generated, or a plasma region P can be formed. According to this embodiment, the electrons are guided to the center of the chamber 2 by the magnetic flux, and the discharge gas becomes the plasma in the center of the chamber 2, so that the generated plasma can be uniformed in density. Furthermore, the electrons emitted from the right and left plasma guns 3 can flow symmetrically, so that the plasma region P formed in the chamber 2 is bilaterally symmetric.

When the deposition is performed in the deposition apparatus 1, the deposition material in the crucible 5 is dissolved by the heater 5a and a reaction gas for causing a chemical reaction with the deposition material is introduced into the chamber 2 under the condition that the plasma region P is formed in the chamber 2. As a result, the deposition material chemically reacts with the reaction gas, and it reaches the glass substrate 4, whereby a film is formed on the surface of the glass substrate 4. In the plasma region P, the chemical reaction between the deposition material and the reaction gas is accelerated by the plasma. As described above, the plasma region P having the uniform plasma density is formed in the deposition apparatus 1, so that the deposited film can be uniformed with high quality. In addition, the reaction gas may be a plasma CVD gas such as TEOS. The substrate may be made of metal or plastic other than the glass. Furthermore, a shape of the substrate may be a plate, or a hoop material supplied from a roll-to-roll mechanism.

Furthermore, as for the actual deposition apparatus 1, operations of the right and left plasma guns 3 could become imbalanced due to asymmetry caused by the shape of the chamber 2 and the evacuation process, an error in structure of the plasma gun 3, and influences of external magnetic field and electric field. In this respect, according to this embodiment, a discharge gas flow rate of the plasma gun 3 can be individually adjusted by the adjusting valve 14, so that plasma forming abilities of the right and left plasma guns 3 can be balanced.

Energy of the plasma formed by each plasma gun 3 depends on a discharge power of the plasma gun 3, that is, depends on a product of a discharge voltage and a discharge current. Therefore, in order to symmetrically form the plasma on right and left sides in the deposition apparatus 1, output powers of the drive circuits are required to be equal to each other. Table 1 shows experimental examples for making the plasma discharge symmetric in the deposition apparatus 1.

TABLE 1

| Conditions | Discharge voltage adjustment | | Discharge gas flow rate adjustment | |
|---|---|---|---|---|
| | Plasma gun 1 | Plasma gun 2 | Plasma gun 1 | Plasma gun 2 |
| Discharge pressure (Pa) | 0.09 | | 0.09 | |
| Discharge power (kw) | 7.8 | 7.8 | 7.8 | 7.8 |
| Discharge current (A) | 120 | 102 | 120 | 120 |
| Discharge voltage (V) | 65 | 76 | 65 | 65 |
| Discharge gas (sccm) | 30 | 30 | 30 | 38 |

The table shows a case where the discharge gas flow rates are equally set in the right and left plasma guns 3 (plasma guns 1 and 2), and the discharge powers are equalized by adjusting the discharge voltages, and a case where the discharge voltages are equally set in the right and left plasma guns 3, and the discharge powers are equalized by adjusting the discharge gas flow rates by the control valves 14.

In the case where the discharge powers are equalized with the discharge voltages, kinetic energy of the emitted electrons varies due to a difference in discharge voltage, and in addition, a value of the discharge current, that is, the number of the emitted electrons becomes imbalanced, so that there is a variation in ionized state of the discharge gas. Meanwhile, in the case where the discharge powers are equalized with the discharge gas flow rates, a discharge gas amount varies, but the discharge voltages and the discharge currents of the plasma guns 3 are equal, respectively, that is, the emitted electron amounts and the kinetic energy are equal, respectively, so that there is no difference in state of the plasma (ionized discharge gas) between the right and left plasma guns.

Thus, as for the deposition apparatus 1, by equally setting the discharge voltages of the right and left plasma guns 3 and adjusting the discharge gas flow rates, the discharge currents can be equal to each other, so that the plasma forming abilities of the right and left plasma guns 3 can be equalized. In addition, as for the deposition apparatus 1, it is preferable that a position and an angle of the converging coil 10 can be individually adjusted, and the operations of the right and left plasma guns 3 can be balanced.

Figure 2:
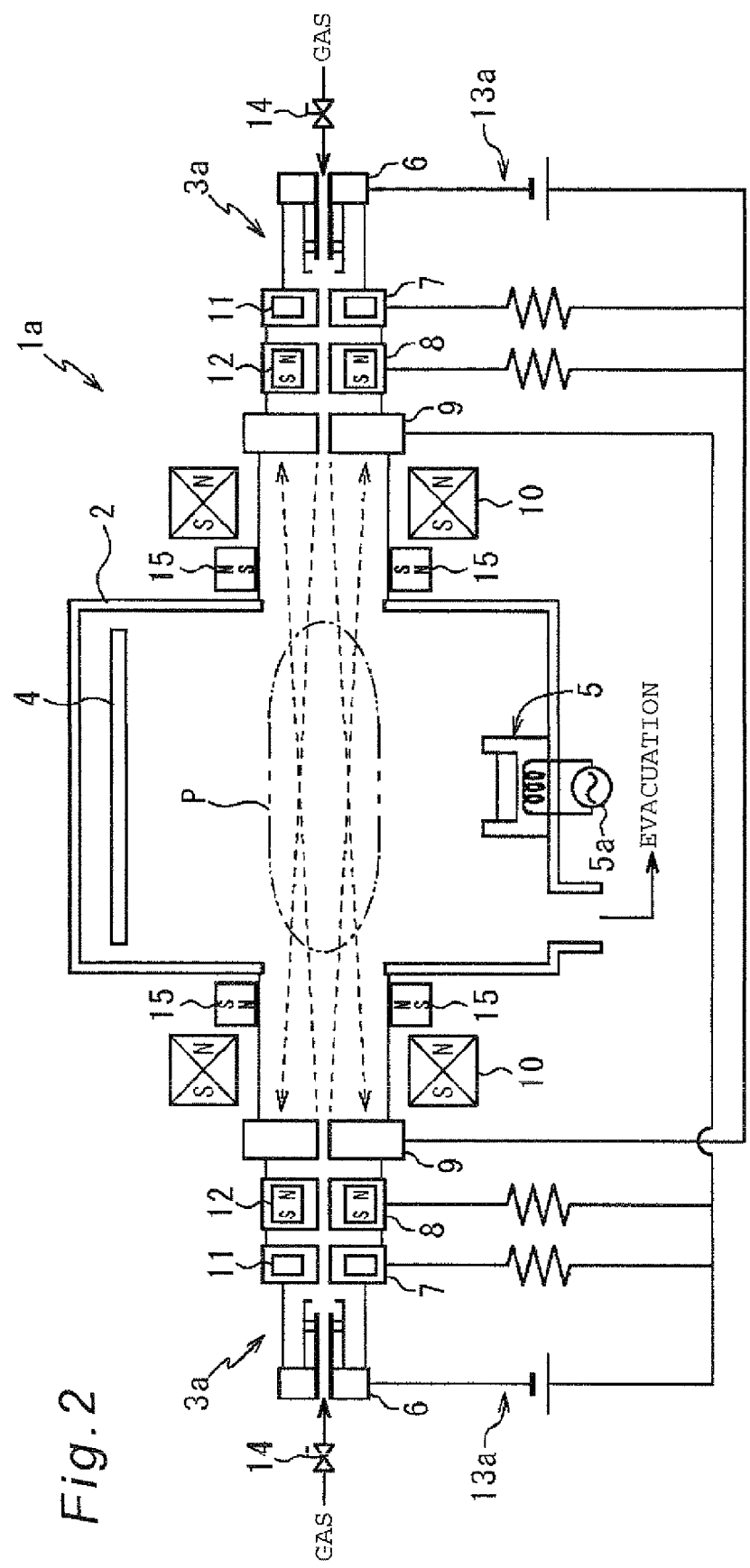
FIG. 2 is a schematic configuration diagram of a deposition apparatus according to a second embodiment of the present invention.
Figure 3:
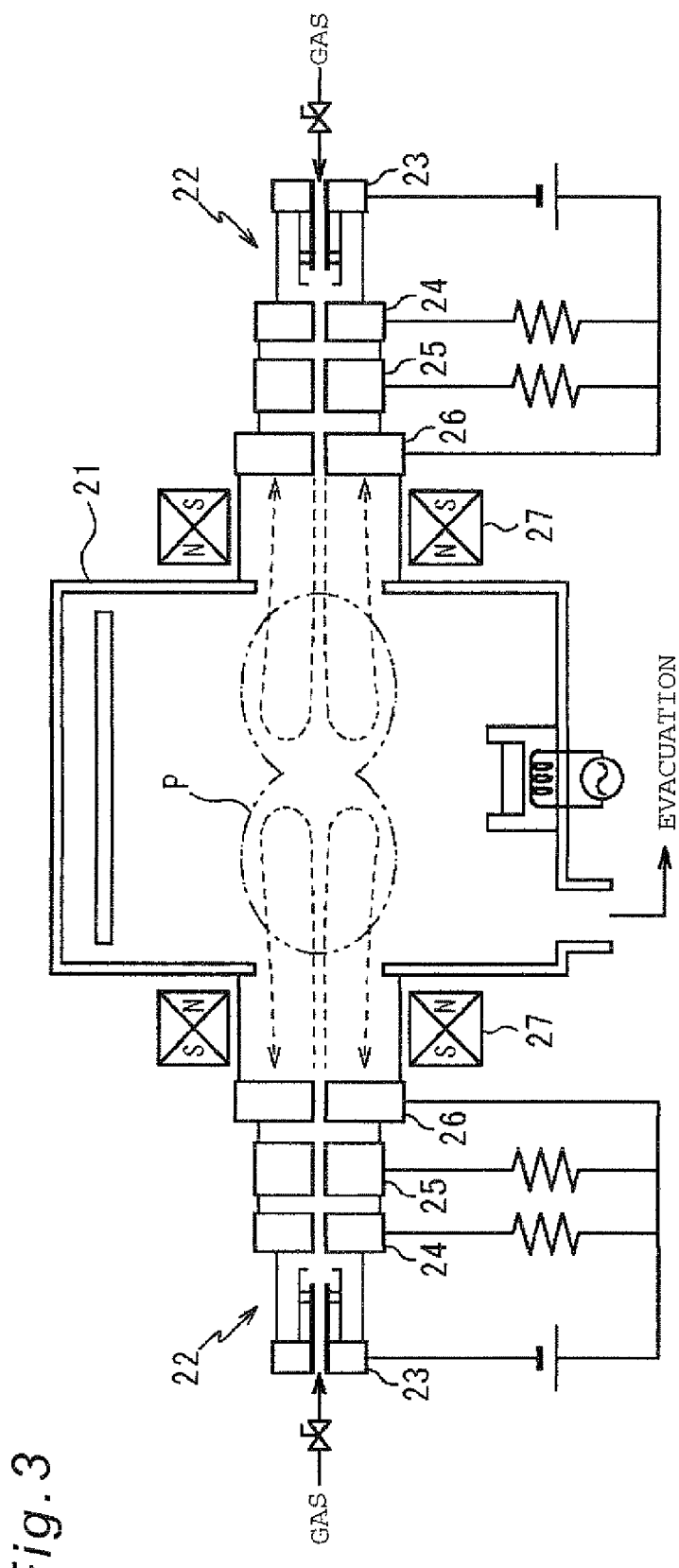
FIG. 3 is a schematic configuration diagram of a conventional deposition apparatus.

Next, FIG. 2 shows a deposition apparatus 1a according to a second embodiment of the present invention. In this embodiment, the same component as that in the first embodiment is marked with the same reference, and a duplicated description is omitted.

A plasma gun 3a in this embodiment has a pair of upper and lower sheet-like magnets 15 in front of the converging coil 10, that is, beside the chamber 2. The sheet-like magnets 15 are arranged so that magnetic poles whose polarity is the same as that of the pole of the converging coil 10 on an outlet side are opposed to each other. Thus, they form a magnetic field which rejects the magnetic flux formed by the converging coil 10, and vertically compress the magnetic flux formed by the converging coil 10. As a result, the magnetic flux formed in the chamber is widely distributed in a horizontal direction, and accordingly, a formation range of the plasma is vertically compressed, and can be spread in the horizontal direction.

Furthermore, according to the deposition apparatus 1a in this embodiment, the feedback electrode 9 is connected to a drive circuit 13a in the opposed plasma gun 3. That is, according to this embodiment, each feedback electrode 9 is supplied only from a power supply of the drive circuit 13 in the opposed plasma gun 3. Therefore, the electrons emitted from the one plasma gun 3 reach the feedback electrode 9 of the other plasma gun 3 without turning back in the center of the chamber 2, as shown by dotted lines. As a result, the density of the generated plasma can be more uniformed.

DESCRIPTION OF REFERENCE SIGNS 1, 1a: Deposition apparatus
2: Chamber
3: Plasma gun
4: Glass substrate (Deposition target body)
5: Crucible
5a: Heater
6: Cathode
7: First electrode
8: Second electrode
9: Feedback electrode
10: Converging coil
11: First electrode internal magnet
12: Second electrode internal magnet
13, 13a: Drive circuit
14: Adjusting valve
15: Sheet-like magnet
P: Plasma region

The invention claimed is:

1. A plasma generation apparatus comprising:
a first plasma gun operatively connected to a first discharge gas control valve;
a second plasma gun operatively connected to a second discharge gas control valve;
said first and second plasma guns being oppositely arranged plasma guns each injecting a discharge gas to be ionized and each of said first and second plasma guns having a cathode for emitting electrons, and a converging coil for forming a magnetic flux to guide the emitted electrons,
wherein:

orientations of polarities of each of the converging coils toward the cathodes in the two plasma guns are opposite to each other, and a discharge voltage of the first plasma gun and a discharge voltage of the second plasma gun are set to be equal and by adjusting the flow rate of the first discharge gas control valve and the flow rate of the second discharge gas control valve a discharge current of the first plasma gun and a discharge current of the second plasma gun are set to be equal, and each of said first and second plasma guns has a pair of magnets between the converging coil and a chamber having magnetic poles whose polarity is the same as that of the pole of the converging coil on an outlet side are opposed to each other.

2. The plasma generation apparatus according to claim 1, wherein each of the plasma gun is a pressure-gradient type plasma gun and each pressure-gradient type plasma gun comprises a first electrode and a second electrode between the cathode and the converging coil, and the second electrode internally houses an electrode internal magnet for forming a magnetic flux having the same direction as the magnetic flux formed by each converging coil.

3. The plasma generation apparatus according to claim 1, wherein the two plasma guns are driven by two drive circuits insulated from each other, respectively.

4. The plasma generation apparatus according to claim 1, wherein at least one of a position and an angle of the converging coil is individually adjustable.

5. The plasma generation apparatus according to claim 1, wherein each of the plasma guns comprises a feedback electrode for collecting the electrons emitted from the cathode, and the feedback electrode is connected to a circuit in the opposed plasma gun.

6. A deposition apparatus comprising the plasma generation apparatus according to claim 1.

* * * * *